(12) United States Patent
Yasui

(10) Patent No.: US 7,685,686 B2
(45) Date of Patent: Mar. 30, 2010

(54) METHOD OF PRODUCING A PIEZOELECTRIC ACTUATOR AND AN INK-JET HEAD

(75) Inventor: Motohiro Yasui, Nagoya (JP)

(73) Assignee: Brother Kogyo Kabushiki Kaisha, Nagoya, Aichi-ken (JP)

( * ) Notice: Subject to any disclaimer, the term of this patent is extended or adjusted under 35 U.S.C. 154(b) by 0 days.

(21) Appl. No.: 11/531,269

(22) Filed: Sep. 12, 2006

(65) Prior Publication Data
US 2007/0052765 A1    Mar. 8, 2007

Related U.S. Application Data

(63) Continuation-in-part of application No. 11/276,999, filed on Mar. 20, 2006, now abandoned.

(30) Foreign Application Priority Data

Mar. 22, 2005    (JP) .............................. 2005-082285

(51) Int. Cl.
*H04R 17/10*    (2006.01)
*B05D 5/12*    (2006.01)

(52) U.S. Cl. ..................... 29/25.35; 29/846; 427/100; 427/123; 427/475; 347/68; 347/71

(58) Field of Classification Search ............... 29/25.35, 29/890.1, 846, 851, 831; 427/100, 475, 190, 427/96.1, 123, 125; 310/340, 321, 328; 257/40; 347/68, 70, 71
See application file for complete search history.

(56) References Cited

U.S. PATENT DOCUMENTS

| | | | | |
|---|---|---|---|---|
| 4,431,686 A | * | 2/1984 | Bewer et al. ............... | 427/125 |
| 4,668,531 A | * | 5/1987 | Asano et al. ............ | 427/123 X |
| 5,802,686 A | * | 9/1998 | Shimada et al. ........... | 29/25.35 |
| 6,531,187 B2 | * | 3/2003 | Akedo ........................ | 427/475 |
| 6,740,900 B2 | * | 5/2004 | Hirai ........................... | 257/40 |
| 6,918,659 B2 | * | 7/2005 | Junhua ....................... | 347/71 |

(Continued)

FOREIGN PATENT DOCUMENTS

EP    1500509 A1    1/2005

(Continued)

OTHER PUBLICATIONS

European Patent Office, European Search Report for Related Application No. EP 06005758, dated Aug. 1, 2007.

*Primary Examiner*—A. Dexter Tugbang
(74) *Attorney, Agent, or Firm*—Baker Botts L.L.P.

(57) ABSTRACT

A method for a piezoelectric actuator and an ink-jet head uses, for forming a lower electrode on a vibration plate, metal-nano particles which can start to sinter with a low temperature as a conductive material; and uses, for forming a piezoelectric layer, an aerosol deposition method requiring no calcination step. Accordingly, upon forming the lower electrode and piezoelectric layer, any calcination under severe condition is not needed. In addition, the calcination of the lower electrode can be advanced simultaneously with an annealing step required after forming the piezoelectric layer. Accordingly, the thermal cycle during producing process can be minimized, thereby suppressing the exfoliation of layers and diffusion of material forming vibration plate into the piezoelectric layer due to thermal history, and consequently lower the degradation of piezoelectric characteristics.

8 Claims, 6 Drawing Sheets

U.S. PATENT DOCUMENTS 7,229,160 B2 6/2007 Kobayashi
2006/0279170 A1 12/2006 Yasui

FOREIGN PATENT DOCUMENTS

| | | | | |
|---|---|---|---|---|
| EP | 1693907 A1 | 8/2006 | | |
| JP | 62277780 A | * | 12/1987 | |
| JP | 63112499 A | * | 5/1988 | |
| JP | H11-334087 A | | 12/1999 | |

* cited by examiner

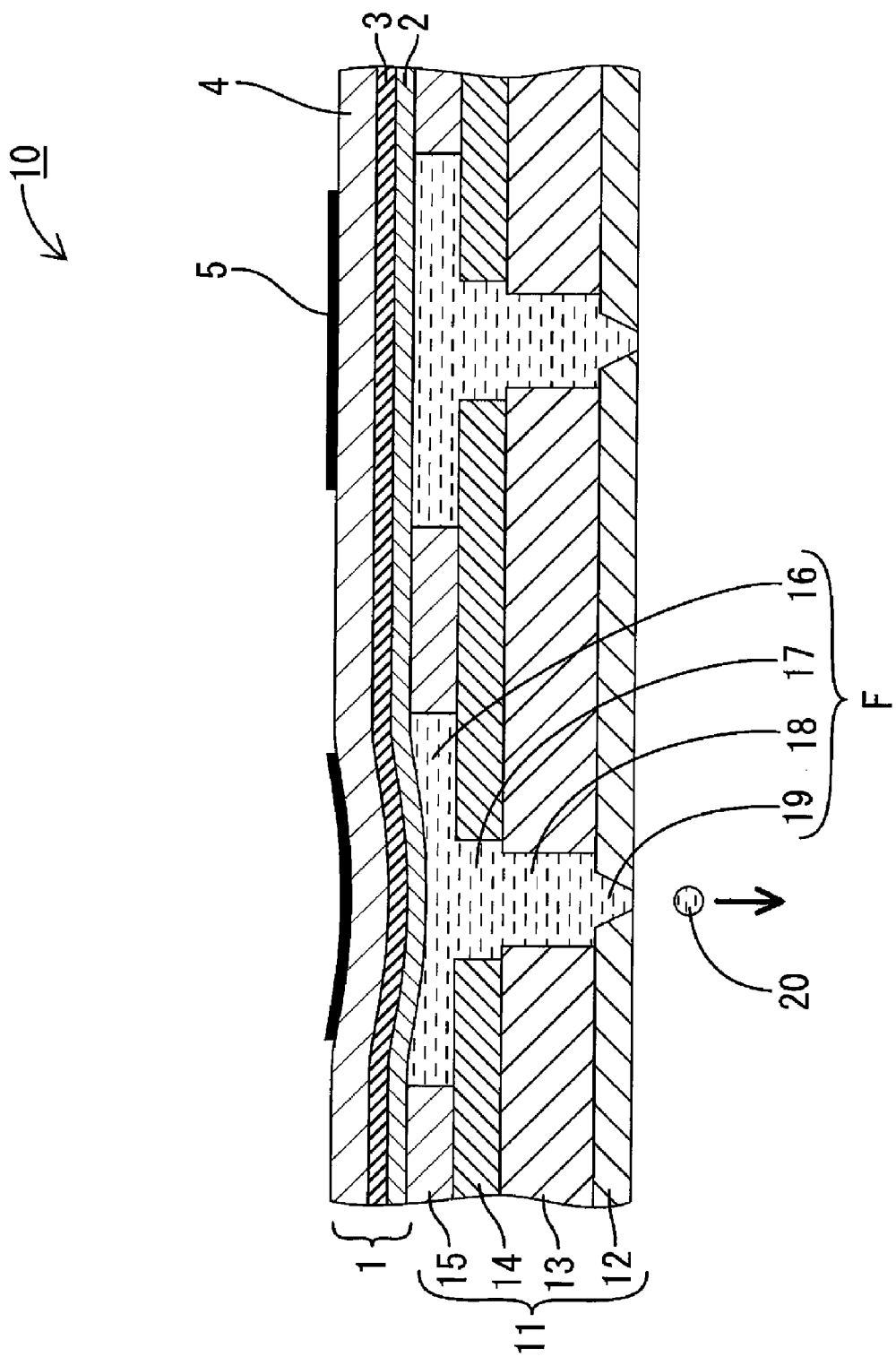

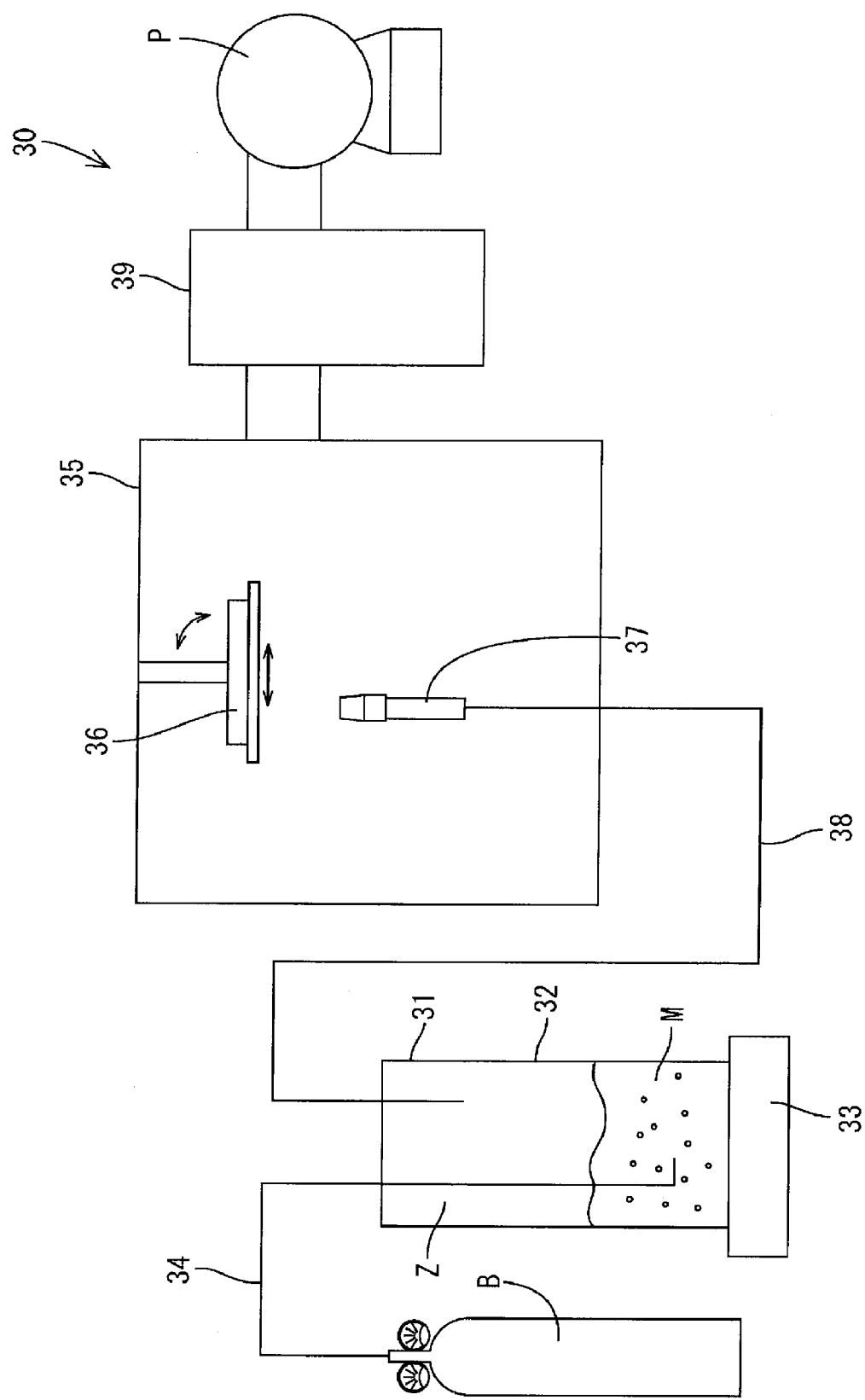

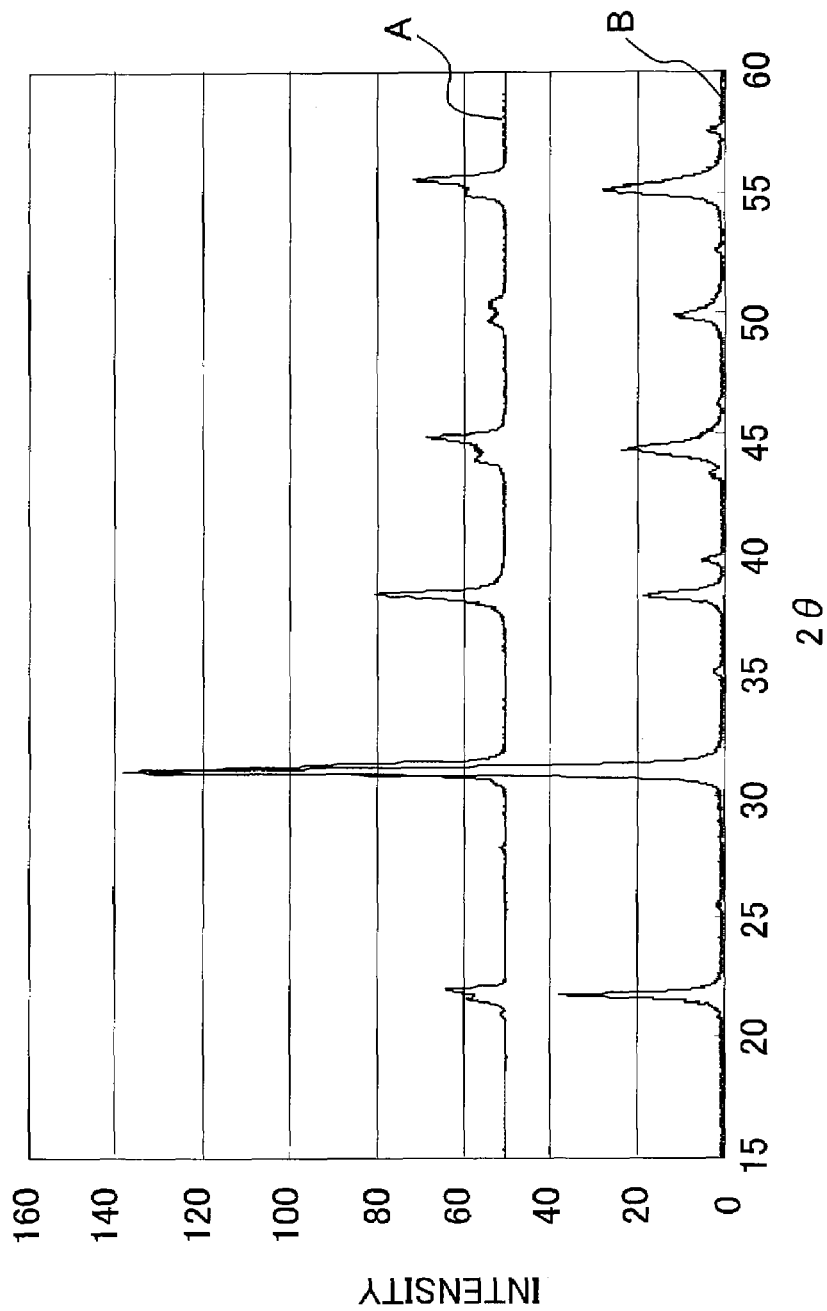

METHOD OF PRODUCING A PIEZOELECTRIC ACTUATOR AND AN INK-JET HEAD

CROSS REFERENCE TO RELATED APPLICATION

The present application is a Continuation-In-Part application of U.S. patent application Ser. No. 11/276,999 filed on Mar. 20, 2006, claiming priority from Japanese Patent Application No. 2005-082285, filed on Mar. 22, 2005, the disclosure of which is incorporated herein by reference in its entirety.

BACKGROUND OF THE INVENTION

1. Field of the Invention

The present invention relates to a piezoelectric actuator, an ink-jet head, a method of producing the piezoelectric actuator, and a method of producing the ink-jet head.

2. Description of the Related Art

An example of a piezoelectric actuator used in an ink-jet head or the like is described in Japanese Patent Application Laid-open No. 11-334087. In this piezoelectric actuator, a substrate (vibration plate) is provided such that the substrate closes openings of pressure chambers each of which communicates with a nozzle opening in a channel forming body; and a lower electrode, a piezoelectric layer, and an upper electrode are stacked in layers (laminated) on this substrate. When an electric field is applied between the upper electrode and the lower electrode, the substrate is bent with the deformation of the piezoelectric layer. Due to this, ink in the pressure chambers is pressurized and is discharged from the nozzle openings of the pressure chambers.

Such a piezoelectric actuator is manufactured, for example, as described below. First of all, a metal paste such as Pt paste is coated and then calcinated to form a lower electrode. Next, a paste containing particles of a piezoelectric material such as lead zirconate titanate (PZT) is coated on the lower electrode, and then calcinated to form a piezoelectric layer on the lower electrode (sol-gel method).

In the above-mentioned method, however, the substrate is exposed to a high-temperature environment during calcination. Accordingly, due to a difference in a coefficient of thermal expansion of materials forming the layers respectively, a stress is generated in an interface of overlapping layers, which in turn causes exfoliation of the layers. Therefore, sufficient piezoelectric characteristics cannot be achieved in some cases. Further, in some cases, an element contained in the substrate passes through the lower electrode layer and diffuses in the piezoelectric layer, thereby degrading the piezoelectric characteristics.

Namely, upon forming the electrode, it is necessary to perform calcination at a very high temperature that is not less than a melting point of the metal as the electrode material (for example, when the electrode material is Pt, not less than 900° C.) Further, upon forming the piezoelectric layer, it is necessary to perform calcination at a very high temperature that is not less than a sintering temperature of an oxide ceramics as the piezoelectric material (for example, not less than 900° C.) Furthermore, in the film formation by the sol-gel method, the upper limit for the thickness of a film formed by one step of paste coating followed by calcination is about several μm. Therefore, to form a layer having a substantial thickness, the step of coating and calcination needs to be repeated for several times. In such a case, the substrate is subjected to high-temperature environment for several times. Since the severe heat treatment is performed repeatedly during the production process, the degradation of piezoelectric characteristics due to the exfoliation of layers and/or the diffusion becomes prominent.

SUMMARY OF THE INVENTION

The present invention is made in view of a situation described above, and an object of the present invention is to provide a piezoelectric actuator and an ink-jet head which are capable of suppressing the degradation of piezoelectric characteristics. Another object of the present invention is to provide a method of producing the piezoelectric actuator and a method of producing an ink-jet head with less thermal load and with a simple process.

The inventor of the present invention found out the following fact, through his diligent research for developing the piezoelectric actuator and ink-jet head capable of suppressing the degradation of the piezoelectric characteristics and for developing the methods of producing the piezoelectric actuator and the ink-jet head, that the effect of thermal history during the production process can be substantially lowered by using an aerosol deposition method (AD method) for forming the piezoelectric layer while using a low-sintering temperature material as a conductive material for forming the electrode. Thus, the inventor completed the present invention.

According to a first aspect of the present invention, there is provided a method of producing a piezoelectric actuator, including: a first electrode layer forming step of forming, on a substrate, a first electrode layer with a conductive material which start to sinter at a predetermined temperature; a piezoelectric layer forming step of forming, on the first electrode layer, a piezoelectric layer by blowing aerosol containing particles of a piezoelectric material onto the first electrode layer to deposit the particles of the piezoelectric material on the first electrode layer; an annealing treatment step of subjecting the piezoelectric layer to an annealing treatment; and a second electrode layer forming step of forming, on the piezoelectric layer, a second electrode layer which pairs with the first electrode layer; wherein the predetermined temperature at which the conductive material starts to sinter is not more than an annealing temperature in the annealing treatment step.

According to the present invention, the piezoelectric layer is formed by using the aerosol deposition method (a method for forming a thin film by blowing aerosol containing particle material (particulate material) to a target object to deposit the material thereon) in which no calcination step is required; and a low-sintering temperature material, which starts to sinter at a temperature (sintering-start temperature) that is not more than the annealing temperature in the step of subjecting the piezoelectric layer to annealing treatment, is used as a conductive material for forming the electrode layer on the substrate. Accordingly, upon forming the first electrode layer and upon forming the piezoelectric layer, there is no need to perform the calcination under a severe condition. In addition, in the annealing step required after the formation of piezoelectric layer, the calcination of the first electrode layer formed of the low-sintering temperature material can be performed simultaneously. In other words, there is no need to perform the calcination of the first electrode layer separately. Accordingly, the thermal cycle during the producing process can be made as minimum as necessary, thereby suppressing the exfoliation of layers and diffusion of substrate material into the piezoelectric layer due to the thermal history. Thus, it is possible to lower the degradation of piezoelectric characteristics. Further, it is possible to simplify the producing process, thereby contributing to the energy conservation.

The conductive material, which is used in the present invention and which starts to sinter at a predetermined temperature (low-sintering temperature material) may use a material containing metal-nano particles having a nano-scale particle size, specifically metal-nano particles having a particle size of not more than 50 nm (for example, a material in paste form). In such metal-nano particles having a very small particle size, even at a low temperature that is not more than an original melting point of the metal forming the metal-nano particles, a portion near the surface of each of the metal-nano particles is melted, and the nano particles are adhered to each other. Accordingly, it is possible to obtain adhesiveness to some extent (see FIG. 4). In particular, in the annealing treatment, it is possible to melt a substantial portion of the surfaces of metal particles by the annealing temperature, and to promote the adhesion between the particles due to the grain growth, thereby making the particles to tightly adhere to the substrate. As the metal for forming the metal-nano particles, for example, silver, gold or platinum can be used.

The method of the present invention may further include, before the annealing treatment step, a pre-calcination step of subjecting the first electrode layer to a pre-calcination at a temperature of not more than 420° C. In the pre-calcination, it is preferable that a temperature for pre-calcination is as low as possible to an extent at which the conductive material can be melted and the particles can be adhered to each other. Specifically, the temperature of pre-calcination may be not more than 420° C., for the purpose of suppressing the effect of thermal history as small as possible.

Further, it is preferable that the annealing temperature in the annealing step is as low as possible to an extent at which the piezoelectric characteristics of piezoelectric layer can be restored and the first electrode layer can be sufficiently calcinated. Specifically, the annealing temperature is preferably 600° C. to 1,000° C., especially preferably 600° C. to 900° C. Further, the predetermined temperature at which the conductive material starts to sinter may be not more than 420° C. which is lower than the annealing temperature.

According to a second aspect of the present invention, there is provided a piezo electric actuator including a first electrode layer which is formed on a substrate and which includes metal-nano particles having a particle size of not more than 50 nm; a piezoelectric layer provided on the first electrode layer by blowing aerosol containing particles of a piezoelectric material onto the first electrode layer to deposit the particles on the first electrode layer; and a second electrode layer which is arranged on the piezoelectric layer and which pairs with the first electrode layer. This piezoelectric actuator includes the first electrode layer formed of the metal-nano particles having a particle size of not more than 50 nm and which is a low-sintering temperature material, and includes the piezoelectric layer formed by the aerosol deposition method. Accordingly, the piezoelectric actuator has satisfactory piezoelectric characteristics since the thermal loading in these layers are small during the producing process, and the diffusion of element from the substrate is suppressed.

The piezoelectric actuator and the method of producing the piezoelectric actuator according to the present invention is applicable to an ink-jet head used in an ink-jet printer or the like.

BRIEF DESCRIPTION OF THE DRAWINGS

FIG. 1 is a cross-sectional diagram of an ink-jet head of an embodiment of the present invention;

FIG. 2 (FIGS. 2A to 2D) is a cross-section diagram showing a producing process of an actuator plate, in which

FIG. 3 is a schematic diagram of a film forming apparatus;

FIG. 6 shows XRD (X-ray diffraction) spectra of a piezoelectric layer formed by calcinating green sheet and of a piezoelectric layer formed by the aerosol deposition method.

DETAILED DESCRIPTION OF THE PREFERRED EMBODIMENTS

Figure 2A:
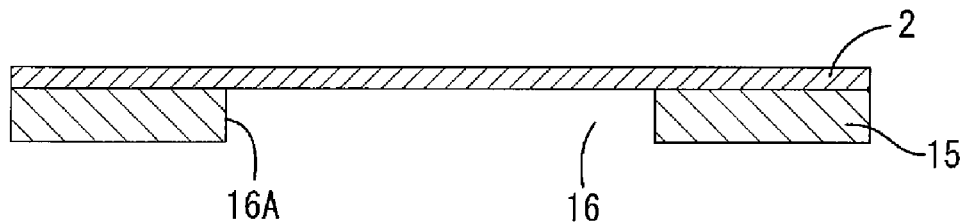
FIG. 2A shows a state in which a vibration plate is joined to a pressure chamber plate.

An embodiment of the present invention will be described with reference to FIGS. 1 to 3.

FIG. 1 shows an ink-jet head 10 of this embodiment. The ink-jet head 10 includes a channel unit 11 (corresponding to the ink-channel forming body of the present invention) which has a plurality of pressure chambers 16 accommodating an ink 20 and an actuator plate 1 (corresponding to the piezoelectric actuator of the present invention) which is joined to the channel unit 11 so as to close the pressure chambers 16.

The channel unit 11 as a whole is in the form of a flat plate in which a nozzle plate 12, a manifold plate 13, a channel plate 14, and a pressure-chamber plate 15 are stacked in layers in sequence, and the channel unit 11 has a construction in which the plates 12, 13, 14, and 15 are joined to one another with an epoxy-based thermosetting adhesive.

The nozzle plate 12 is formed of a polyimide-based synthetic resin material, and a plurality of holes which are to become ink-discharge nozzles 19 for jetting ink 20 are formed and aligned in the nozzle plate 12. The manifold plate 13 is formed, for example, of stainless steel (SUS 430), and a plurality of holes which are to become nozzle channels 18 connected to the nozzles 19 respectively are provided in the manifold plate 13. The channel plate 14 is formed also of the stainless steel (SUS 430), and a plurality of holes which are to become pressure channels 17 communicating with the nozzle channels 18 respectively are provided in the channel plate 14. The pressure-chamber plate 15 is also formed of stainless steel (SUS 430), and a plurality of holes which are to become a plurality of pressure chambers 16 communicating with the pressure channels 17 respectively are provided in the pressure-chamber plate 15. The pressure chambers 16 are connected to an ink tank (not shown), via a manifold channel and a common ink chamber (not shown) provided in manifold plate 13 and the channel plate 14 respectively. Thus, there are formed ink channels F each of which is from the common ink chamber connected to the ink tank to one of the ink-discharge nozzles 19, via the manifold channel, one of the pressure chambers 16, one of the pressure channels 17, and one of the nozzle channels 18.

The actuator plate 1, which is stacked on the channel unit 11, is constructed of a vibration plate 2 (substrate) which forms a part of wall surfaces of the pressure chambers 16; a lower electrode 3 (first electrode layer) formed on the vibration plate 2; a piezoelectric layer 4 stacked on the lower electrode 3, and an upper electrode 5 (second electrode layer) provided on the piezoelectric layer 4.

The vibration plate 2 is formed, for example, of stainless steel (SUS 403) in a rectangular shape, and is joined to the upper surface of the channel unit 11 by thermo-compression bonding, and covers the entire upper surface of the channel unit 11. Further, this vibration plate 2 is formed of a kind of a metallic material that is same as those for forming the manifold plate 13, the channel plate 14, and the pressure chamber plate 15 which construct the channel unit 11. Accordingly, it is possible to prevent warpage or curling during the thermo-compression bonding of the vibration plate 2 to the channel unit 11.

The lower electrode 3 is formed over an entire surface of the vibration plate 2, the surface being on a side opposite to the other surface of the vibration plate in contact with the channel unit 11. This lower electrode 3 is connected to ground of a drive circuit IC (not shown) and is used also as a ground electrode. The lower electrode 3 is formed of metal nano-particles (Ag particles in this case) having a particle size of not more than 50 nm. The thickness of the lower electrode 3 may be 100 to 300 nm for the following reason. That is, when a conductive paste containing metal particles having a particle size of several μm, which is a general particle size, is used to form the electrode layer, the formed electrode layer has a thickness of about 4 to 10 μm because such metal particles as the base for the conductive paste has a large particle size. On the other hand, when a conductive paste containing metal-nano particles is used, it is possible to form a thin electrode layer because the metal-nano particle as the base for the conductive paste has a small particle size.

The piezoelectric layer 4 is formed of a ferroelectric piezoelectric ceramics material such as lead zirconate titanate (PZT), and is stacked on an entire surface of the vibration plate 2, and with a uniform thickness, while sandwiching the lower electrode 3 between the piezoelectric layer 4 and the vibration plate 2. This piezoelectric layer 4 is formed by the aerosol deposition method, and subjected to a polarization treatment such that the piezoelectric layer 4 is polarized in a direction of thickness of the piezoelectric layer 4.

The upper electrode 5 is formed as a plurality of upper electrodes 5 on a surface of the piezoelectric layer 4, the surface being on a reverse side of the other surface of the piezoelectric layer 4 in which the piezoelectric layer 4 is tightly adhered to the vibration plate via the lower electrode 3. Each of the upper electrodes 5 is provided on the surface of the piezoelectric layer 4 at an area corresponding to an opening 16a (see FIGS. 2A to 2D) of one of the pressure chambers 16. Each of the upper electrodes 5 is connected to the drive circuit IC and used as a drive electrode.

Upon performing a printing, a predetermined drive signal is outputted from the drive circuit IC to a certain upper electrode 5 of the upper electrodes 5, then electric potential of the upper electrode 5 becomes higher than an electric potential of the lower electrode 3, and an electric field is applied in a polarization direction (direction of thickness) of the piezoelectric layer 4. Then, an area of the piezoelectric layer 4 sandwiched between the upper electrode 5 and the lower electrode 3 is extended in the thickness direction and is contracted in a plane direction of the piezoelectric layer 4. Accordingly, the area of the piezoelectric layer 4 and an area of the vibration plate 2 (namely, the actuator plate 1) which correspond to an opening 16A of a pressure chamber 16 associated with the upper electrode 5 is locally deformed (unimorph deformation) to project toward the pressure chamber 16. Therefore, the volume of the pressure chamber 16 is decreased, a pressure of the ink 20 in the pressure chamber 16 is increased, and the ink 20 is jetted from the ink-discharge nozzle 19. Thereafter, when the upper electrode 5 returns to an electric potential same as the electric potential of the lower electrode 3, the piezoelectric layer 4 and the vibration plate 2 restore to their original shape and the volume of the pressure chamber 16 returns to the original volume, thereby sucking the ink 20 from the manifold channel communicating with the ink tank.

Next, a method of producing this ink-jet head 10 will be explained. First of all, holes which are to become the nozzle channels 18, the pressure channels 17, and the pressure chambers 16 are formed by etching in the manifold plate 13, the channel plate 14, and the pressure chamber plate 15 respectively. These plates 13 to 15 are formed of stainless steel. Next, the manifold plate 13, the channel plate 14, and the pressure chamber plate 15 are joined in a laminated state, thereby forming a substantial part of the channel unit 11 (step for forming channel-unit forming body). Since the nozzle plate 12 is formed of a synthetic resin material, the nozzle plate 12 is melted when heated at the time of annealing treatment which will be described later. Therefore, the nozzle plate 12 is not joined at this time but will be joined after the annealing treatment.

Next, as shown in FIG. 2A, the vibration plate 2 formed of stainless steel is overlapped with the channel unit 11, while being positioned on the upper surface of the pressure chamber plate 15 in the channel unit 11, and joined to the pressure chamber plate 15 by thermo-compression bonding, thereby closing the pressure chambers 16 by the vibration plate 2 (vibration plate joining step).

Figure 2B:
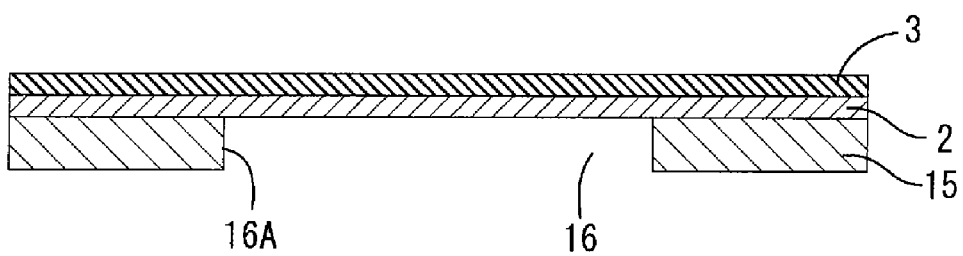
FIG. 2B shows a state in which a lower electrode is formed on the vibration plate.

Next, as shown in FIG. 2B, the lower electrode 3 which also serves as a diffusion-preventive layer is formed on the vibration plate 2 (first electrode layer forming step). First of all, a paste is prepared in which silver nano-particles having a particle size of not more than 50 nm (in this embodiment, silver nano-particles having an average particle size of 50 nm) are dispersed in a dispersing agent, and then the paste is coated on the vibration plate 2. Although it is possible to subsequently perform only the drying of the formed lower electrode 3 and then proceed to the next step for forming piezoelectric layer, it is preferable to perform a pre-calcination in view of ensuring the strength to the extent for sufficiently withstanding the impact caused by material particles M colliding onto the lower electrode 3 in the piezoelectric layer forming step. Here, the metal-nano particles having a particle size of not more than 50 nm is a low-melting point material which is melted and fused at a temperature which is lower than an original melting point of the metal of the metal-nano particles. Accordingly, it is possible to perform the calcination at a low temperature (sintering-start temperature) which is about 250° C. to 420° C. (in particular, 150° C. to 400° C.). In this step, it is enough that the pre-calcination is performed at a minimum temperature and for a minimum duration of time because the calcination of the lower electrode 3 is advanced also in the annealing step which will be explained later. In this manner, by suppressing the heating process in the electrode formation to be as minimum as necessary, the effect of thermal history can be made as small as possible. Further, since the sintering-start temperature is sufficiently lower than the maximum shrink temperature as will be explained later, the calcination at the sintering-start temperature causes the conductive material forming the lower electrode 3 to become compact, but does not cause any growth and/or increase of grain boundary. Accordingly, it is possible to prevent the element contained in the vibration plate from diffusing in the piezoelectric layer.

Figure 2C:
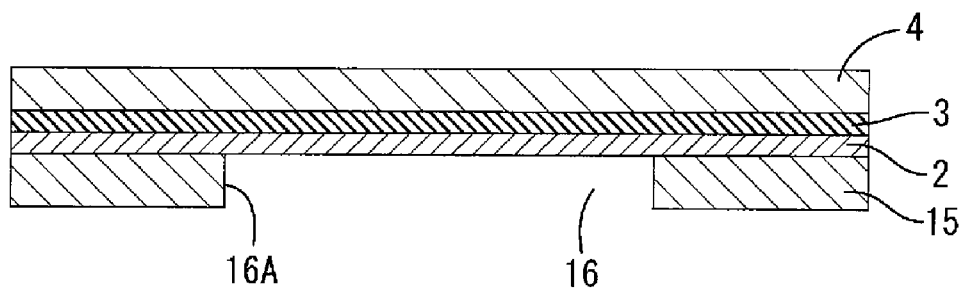
FIG. 2C shows a state in which a piezoelectric layer is formed on the vibration plate.

Next, as shown in FIG. 2C, the piezoelectric layer 4 is formed by the aerosol deposition method (AD method) (piezoelectric layer forming step). FIG. 3 shows a schematic diagram of a film forming apparatus 30 for forming the piezoelectric layer 4. This film forming apparatus 30 includes an aerosol generator 31 which forms an aerosol Z by dispersing material particles M in a carrier gas, and a film forming chamber 35 for depositing aerosol Z on a substrate by jetting the aerosol Z from an ejection nozzle (jetting nozzle) 37.

The aerosol generator 31 includes an aerosol chamber 32 capable of accommodating the material particles M inside thereof, and a vibration unit 33 which is attached to the aerosol chamber 32 and which causes the aerosol chamber 32 to vibrate. A gas cylinder B for introducing the carrier gas is connected to the aerosol chamber 32 via an introduction pipe 34. An end of the introduction pipe 34 is positioned near the bottom surface in the aerosol chamber 32 so that the end is buried in the material particles M. As the carrier gas, an inert gas such as helium, argon, and nitrogen, or a gas such as air and oxygen can be used.

The film forming chamber 35 includes a stage 36 for attaching or mounting the substrate where the piezoelectric layer 4 will be formed, and the ejection nozzle 37 which is provided below the stage 36. The ejection nozzle 37 is connected to the aerosol chamber 32 via an aerosol supply pipe 38 so as to supply the aerosol Z in the aerosol chamber 32 to the ejection nozzle 37 through the aerosol supply pipe 38. Moreover, a vacuum pump P is connected to this film forming chamber 35 via a powder recovery unit 39 so as to decompress the inside of the film forming chamber 35.

When the piezoelectric layer 4 is formed by using this film forming apparatus 30, first of all, the vibration plate 2 is set in the stage 36. Next, the material particles M are charged into the aerosol chamber 32. As the material particles M, for example, lead zirconate titanate (PZT) can be used.

Then, the carrier gas is introduced from the gas cylinder B so that the material particles M are made to rise up by gas pressure. At the same time, the aerosol chamber 32 is vibrated by the vibration unit 33, thereby mixing the material particles M with the carrier gas to generate the aerosol Z. Further, the inside of the film forming chamber 35 is decompressed by the vacuum pump P to generate pressure difference between the aerosol chamber 32 and the film forming chamber 35. Due to the pressure difference, the aerosol Z in the aerosol chamber 32 is ejected or jetted from the ejection nozzle 37 while accelerating the aerosol to a high velocity. The material particles M contained in the ejected aerosol Z are collided on the vibration plate 2 and deposited on the vibration plate 2, thereby forming the piezoelectric layer 4. Here, since the aerosol deposition method utilizes a phenomenon in which the material particles are completely solidified due the impact of collision, the aerosol deposition method is a thin film formation process which does not require any calcination. By employing such a process for forming the piezoelectric layer, it is possible to minimize the thermal cycle during the production process.

Next, for obtaining the required piezoelectric characteristics, the annealing treatment is performed for the formed piezoelectric layer 4 (annealing treatment step). The annealing temperature can be 600° C. to 1,000° C., preferably 600° C. to 900° C. In this embodiment, the annealing treatment is performed at 600° C. for 30 minutes. Since the sintering-start temperature of the lower electrode 3 is lower than this annealing temperature, the calcination of the lower electrode 3 is advanced by the annealing treatment. Accordingly, the lower electrode 3 adheres tightly to the vibration plate 2 and/or the piezoelectric layer 4. In this manner, since the annealing step required after the formation of piezoelectric layer 4 can also serve as a main calcination step for the lower electrode 3, the thermal cycle during the production process can be made as minimum as necessary, and the production process can be simplified. When the piezoelectric layer 4 is formed by the aerosol deposition method, the crystallinity of the piezoelectric layer is different from that in a case when the piezoelectric layer is formed by a different method, such as a method of calcinating green sheet and the sputtering method. Accordingly, it is relatively easy to identify that the piezoelectric layer has been formed by the aerosol deposition method by analyzing the crystallinity with the X-ray diffraction or the like. For a reference purpose, FIG. 6 shows XRD (X-ray diffraction) spectra of a piezoelectric layer (sintered body) formed by calcinating green sheet and of a piezoelectric layer formed by the aerosol deposition method. From FIG. 6, it is appreciated that the spectrum of the piezoelectric sheet formed by the aerosol deposition method clearly has peaks at diffraction angles of about 45 degrees and about 55 degrees. On the other hand, the spectrum of the piezoelectric sheet formed by calcinating green sheet does not have peaks at the diffraction angles of these degrees. This indicates that the piezoelectric layer formed by calcinating green sheet and the piezoelectric layer formed by the aerosol deposition method have mutually different crystalline structures.

Figure 4:
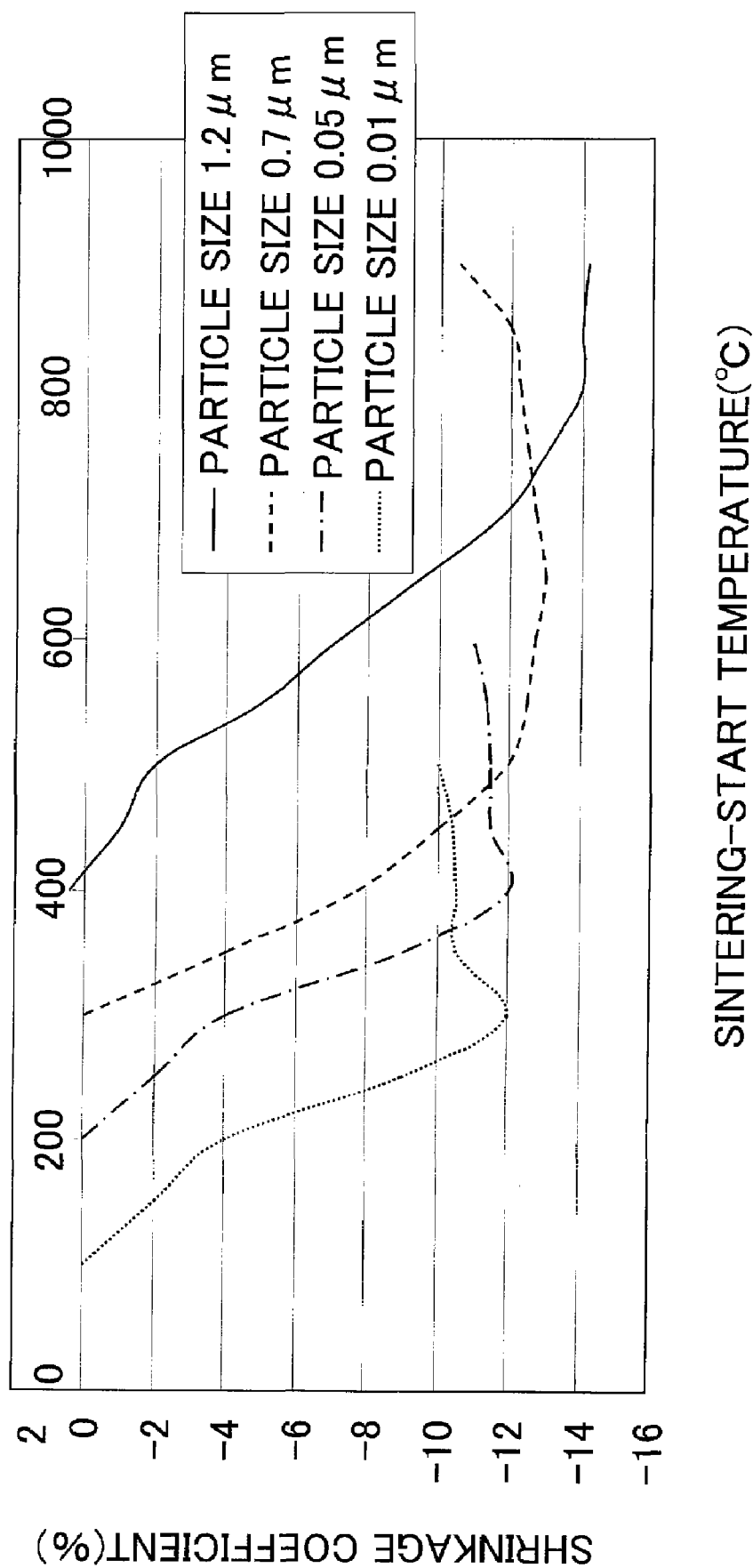
FIG. 4 is a graph showing a change in a shrinkage coefficient of diffusion-preventive layers, formed of silver particles having different average particle sizes respectively, with respect to temperature.

The sintering-start temperature of the lower electrode 3 will be explained. The term "sintering-start temperature" in the present application means a temperature (shrinkage-start temperature) at which a conductive material starts to shrink due to the heating during calcination of the conductive material. FIG. 4 shows a change in a shrinkage coefficient of conductive materials containing Ag particles having different average particle sizes respectively, with respect to temperature (behavior of the conductive materials during calcination). The shrinkage coefficient was calculated from a measured value of stress exerted on the electrode layer measured with a stress measurement device. Any of the conductive materials starts to shrink at a predetermined temperature as being heated. The shrinkage of a conductive material is caused by a melting of metal particles contained in the conductive material. The shrinkage-start temperature is a temperature at which the shrinkage coefficient starts to increase from 0% (to increase in the negative direction). From FIG. 4, it is appreciated that the shrinkage-start temperature is different depending on the particle size of Ag particles contained in the conductive material. When the particle size is 10 nm (0.01 µm), the shrinkage-start temperature is about 150° C.; and a gap between the metal particles disappears as the metal particles are melted as the temperature is elevated (heating), and the shrinkage coefficient is increased. Then, the shrinkage coefficient reaches a maximum value at around 270° C. (maximum shrink temperature). Afterwards, as the temperature is further elevated beyond this temperature, the shrinkage coefficient is gradually decreased. It is considered that, after exceeding the maximum shrink temperature, the grain boundary (border) in the conductive material is substantially great and is developed, for example, to an extent surpassing 1 µm. It is conceived that when the grain boundary (boarder) is developed in this manner, the element forming the substrate is easily diffused in the piezoelectric layer through the grain boundary. Therefore, in view of preventing the diffusion, the annealing temperature preferably does not exceed the maximum shrink temperature.

When the particle size is 50 nm (0.05 µm), the shrinkage-start temperature is about 200° C., and the shrinkage coefficient is increased as the temperature is elevated. Then, the shrinkage coefficient reaches a maximum value at around 400° C. (maximum shrink temperature). Afterwards, as the temperature is further elevated beyond this temperature, the shrinkage coefficient is gradually decreased. When the particle size is 700 nm (0.7 μm), the shrinkage-start temperature is about 330° C., and the maximum shrink temperature is 700° C. When the particle size is 1,200 nm (1.2 μm), the shrinkage-start temperature is about 420° C., and the maximum shrink temperature is 800° C. From FIG. 5 showing a change in the maximum shrink temperature with respect to the average particle size, it is appreciated that the particle size is preferably small in a relationship between the particle size and the annealing temperature because the maximum shrink temperature is increased depending on the particle size.

Figure 5:
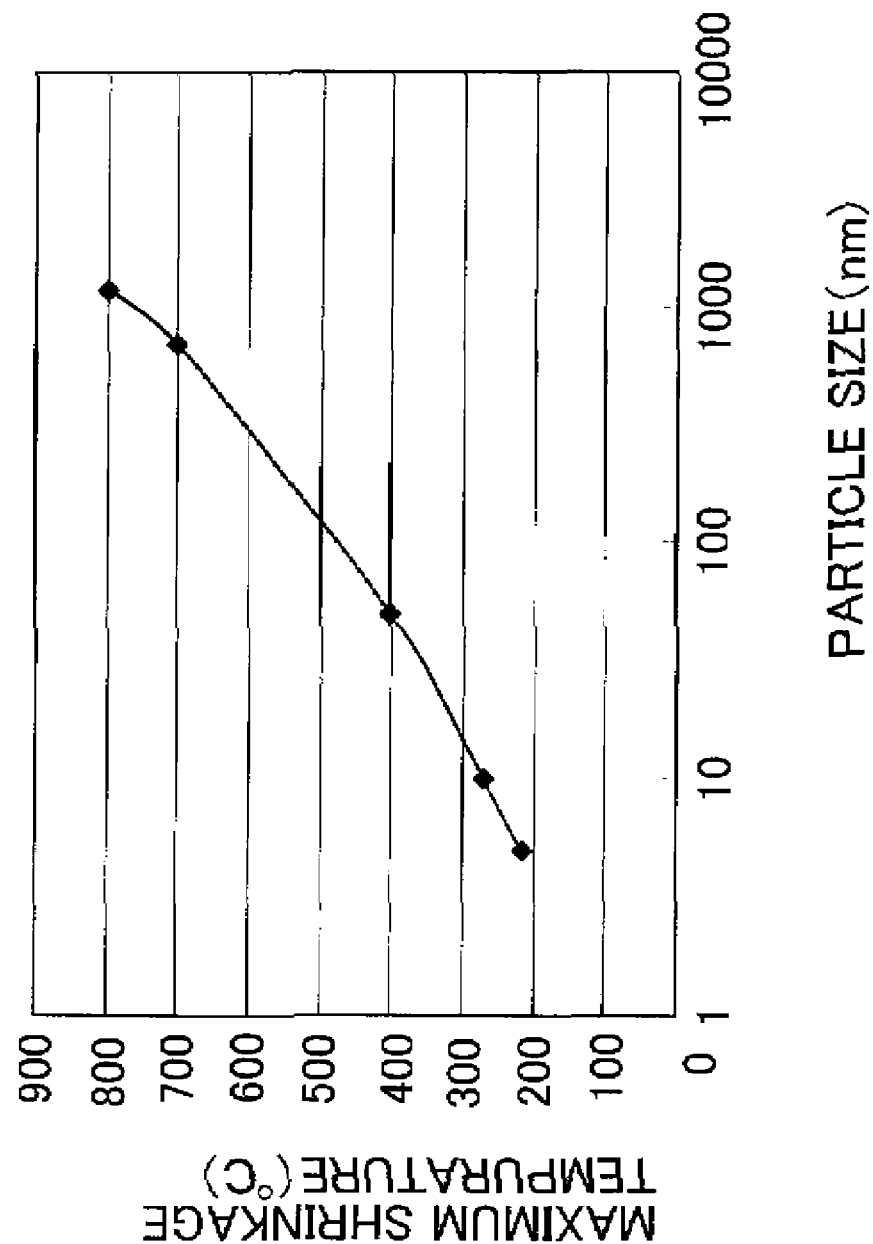
FIG. 5 is a graph showing a change in the maximum shrink temperature with respect to the average particle size of silver particles obtained from FIG. 4.

In FIGS. 4 and 5, the shrinkage coefficient of the average particle size of 50 nm and 10 nm was calculated as follows by using a paste including commercially available silver particles (particle size: 5 nm). A logarithmic indication of the maximum shrink temperature with respect to the various average particle sizes is expected to be substantially linear. Based on such knowledge, the inventor obtained, by calculating at each temperature (power regression $y=b*x^n$), the shrinkage coefficient for the average particle size of 10 nm and 50 nm with a value at the maximum shrink temperature from 210° C. to 220° C. (catalogue value of HARIMA CHEMICALS, INC.) as a reference value (215° C.), by using a paste of silver particles having the average particle size of 5 nm (HARIMA CHEMICALS, INC.: NPS-J) Specifically, as shown in FIG. 4, temperatures (maximum shrink temperatures) showing the maximum shrinkage coefficient which is obtained from data for the average particle size of 5 nm, 700 nm, and 1.2 μm respectively are plotted, and an approximate curve was determined such that the minimum square error (here $(1-R^2)$) of the approximate curve (=power regression curve) becomes the minimum (b=148.93, n=0.2371, $R^2$=0.9997). In this case, $R^2$ is also called as a coefficient of determination, and is an index which is commonly used as a value showing a statistical certainty. The coefficient of determination is an amount of statistic expressing a proportion of a portion where a variation of Y can be explained by a variation of X when a variable Y (explained variable) is subjected to regression analysis by a certain variable X (explanatory variable). The coefficient of determination takes a value between 0 and 1 (it shows that as the coefficient of determination is closer to 1, the proportion of the portion which can be explained is higher). Based on this determined approximate curve, temperatures at which the particle size of 10 nm and 50 nm attain the maximum shrinkage coefficient (maximum shrink temperature) respectively were estimated, and temperature of 270° C. for 10 nm and temperature of 400° C. for 50 nm were calculated.

Figure 2D:
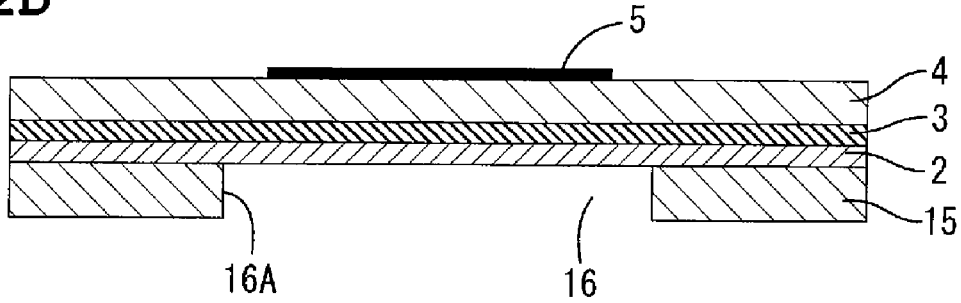
FIG. 2D shows a state in which an upper electrode is formed on the piezoelectric layer.

Back to the production process shown in FIGS. 2A to 2D, next, as shown in FIG. 2D, the upper electrodes 5 and a plurality of lead portions (not shown in the diagram) connected to the upper electrodes 5 respectively are formed at areas on the upper surface of piezoelectric layer 4, each of the areas corresponding to one of the pressure chambers 16 (second electrode forming step). For forming the upper electrodes 5 and the lead portions, for example, after forming a conductor film on the entire area of the piezoelectric layer 4, a predetermined pattern may be formed by using a photolithographic etching method, or may be formed by screen printing directly on the upper surface of the piezoelectric layer 4.

Afterwards, an electric field stronger than at the time of a normal ink-jetting operation is applied between the upper electrodes 5 and the lower electrode 3, and the piezoelectric layer 4 between both of the electrodes is polarized in the direction of thickness (polarizing step). Finally, the nozzle plate 12 is joined to the manifold plate 13, thus completing the actuator plate 1.

As explained above, according to this embodiment, a metal-nano particles which can start to sinter at a low temperature is used as a conductive material for forming the lower electrode 3 on the vibration plate 2. Also, the piezoelectric layer 4 is formed by using the aerosol deposition method (a method forming a thin film by blowing aerosol containing material particles onto a target object to deposit the material particles thereon) which requires no calcination step. According to such a process, in either of the steps for forming lower electrode and for forming piezoelectric layer, there is no need to perform calcination under a severe condition (elevated temperature). In addition, in the annealing step required after the formation of piezoelectric layer 4, the calcination of the lower electrode 3 can be advanced also at the same time. Accordingly, the thermal cycle during the production process can be suppressed as minimum as necessary, thereby suppressing the exfoliation of layers and the diffusion of material forming the vibration plate 2 into the piezoelectric layer due to the thermal history. Thus, it is possible to lower the degradation of piezoelectric characteristics. Further, it is possible to simplify the producing process.

The technical scope of the present invention is not limited to the embodiment as described above, and includes aspects as explained below. Other than these, the technical scope of the present invention also encompasses equivalents for the embodiment and the following aspects.

(1) In the above-described embodiment, although the lower electrode 3 is formed on the vibration plate 2, an intermediate layer may be provided which has various functions such as a diffusion-preventive layer which prevent an element contained in the vibration plate from diffusing in the piezoelectric layer.

(2) In the embodiment, although silver nano-particles are used as a low-sintering temperature material for forming the lower electrode 3, gold nano-particles, for example, may be used.

(3) In the embodiment, although the nozzle plate 12 is formed of a synthetic resin, the nozzle plate 12 may be formed of a metallic material such as stainless steel (SUS430) similar to the manifold plate 13. In this case, the nozzle plate 12 may be joined together with the manifold plate 13, the channel plate 14, and the pressure chamber plate 15, in the channel-unit forming step.

What is claimed is:

1. A method of producing a piezoelectric actuator, comprising:

a first electrode layer forming step of forming, on a substrate, a first electrode layer with a conductive material which starts to sinter at a predetermined temperature;

a piezoelectric layer forming step of forming, on the first electrode layer, a piezoelectric layer formed of crystalline particles of a piezoelectric material by blowing aerosol containing the crystalline particles of the piezoelectric material onto the first electrode layer to deposit the crystalline particles of the piezoelectric material on the first electrode layer;

an annealing treatment step of subjecting the piezoelectric layer to an annealing treatment; and a second electrode layer forming step of forming, on the piezoelectric layer, a second electrode layer which pairs with the first electrode layer;

wherein the predetermined temperature at which the conductive material starts to sinter is not more than an annealing temperature in the annealing treatment step; and a calcination of the first electrode layer is performed simultaneously with the annealing treatment step of the piezoelectric layer.

2. The method according to claim 1, further comprising, before the annealing treatment step, a pre-calcination step of subjecting the first electrode layer to a pre-calcination at a temperature of not more than 420° C.

3. The method according to claim 1, wherein the conductive material contains metal-nano particles having a particle size of not more than 50 nm.

4. The method according to claim 3, wherein a metal of the metal-nano particles is silver.

5. The method according to claim 1, wherein the annealing temperature is 600° C. to 1,000° C.

6. The method according to claim 1, wherein the predetermined temperature at which the conductive material starts to sinter is not more than about 420° C.

7. A method of producing an ink-jet head, comprising:

forming an ink channel forming body provided with a plurality of pressure chambers each of which communicates with an ink discharge nozzle for discharging an ink and each of which has an opening, the opening being open on a side of one surface of the ink channel forming body;

providing a substrate on the side of the one surface of the ink channel forming body so that the substrate closes the opening of each of the pressure chambers; and forming a piezoelectric actuator on the substrate, the step of forming the piezoelectric actuator comprising:

a first electrode layer forming step of forming, on the substrate, a first electrode layer with a conductive material which starts to sinter at a predetermined temperature;

a piezoelectric layer forming step of forming, on the first electrode layer, a piezoelectric layer formed of crystalline particles of a piezoelectric material by blowing aerosol containing the crystalline particles of the piezoelectric material onto the first electrode layer to deposit the crystalline particles of the piezoelectric material on the first electrode layer;

an annealing treatment step of subjecting the piezoelectric layer to an annealing treatment; and a second electrode layer forming step of forming, on the piezoelectric layer, a second electrode layer which pairs with the first electrode layer;

wherein the predetermined temperature at which the conductive material staffs to sinter is not more than an annealing temperature in the annealing treatment step; and a calcination of the first electrode layer is performed simultaneously with the annealing treatment step of the piezoelectric layer.

8. The method according to claim 7, wherein the substrate is a vibration plate.

* * * * *